United States Patent [19]

Yamazaki et al.

[11] 4,087,729
[45] May 2, 1978

[54] POSITION FINELY ADJUSTING APPARATUS

[75] Inventors: Shin-ichi Yamazaki, Chofu; Makoto Asakawa, Mitaka; Tadao Saito, Koganei, all of Japan

[73] Assignee: Nippon Telegraph & Telephone Public Corporation, Japan

[21] Appl. No.: 678,673

[22] Filed: Apr. 20, 1976

[30] Foreign Application Priority Data

Apr. 21, 1975 Japan .................................. 50-48444

[51] Int. Cl.² .............................................. G05B 19/28
[52] U.S. Cl. .................................... 318/601; 318/603; 318/640
[58] Field of Search ................. 318/601, 602, 603, 640

[56] References Cited

U.S. PATENT DOCUMENTS

| | | | |
|---|---|---|---|
| 3,733,484 | 5/1973 | Bayard ................................. | 318/640 |
| 3,786,332 | 1/1974 | Hepner et al. ....................... | 318/577 |
| 3,789,285 | 1/1974 | Nishizawa ........................... | 318/640 X |
| 3,889,164 | 6/1975 | Nishizawa et al. ................. | 318/640 X |
| 3,904,945 | 9/1975 | Hassan et al. ....................... | 318/601 |

Primary Examiner—B. Dobeck
Attorney, Agent, or Firm—Charles W. Helzer

[57] ABSTRACT

The position adjusting apparatus comprises a stationary frame, first and second movable stages respectively, disposed on X and Y axes intersecting at right angles, a plurality of dynamic type electro-mechanical transducers mounted on the axial ends of each movable stage, a first resilient supporting member for mounting the first movable stage to be movable in the direction of X axis, a second resilient supporting member mounted on the first movable stage forming the second movable stage in the direction of the Y axis, and a platform mounted on the second movable stage for supporting an object whose position is to be adjusted.

27 Claims, 14 Drawing Figures

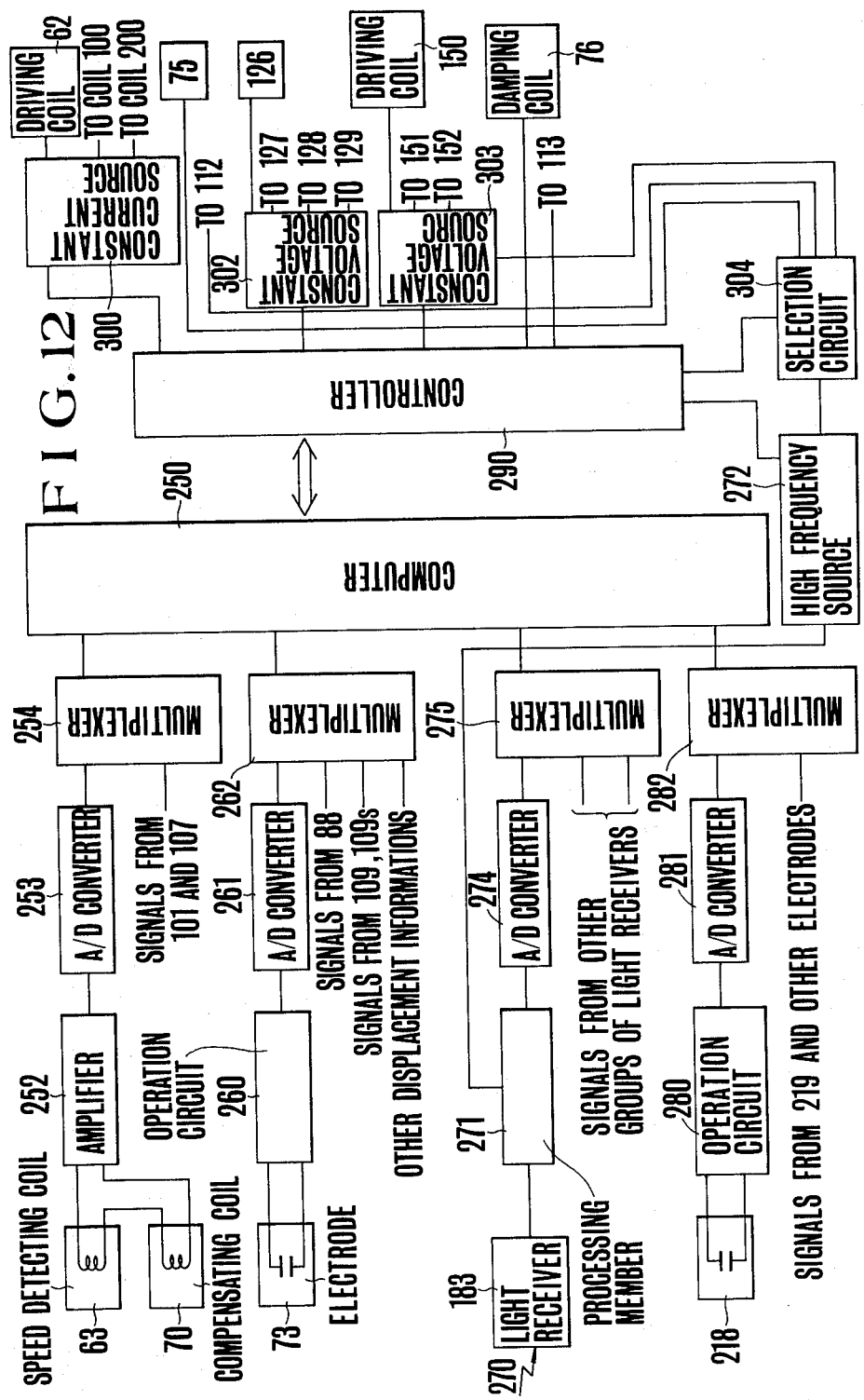

POSITION FINELY ADJUSTING APPARATUS

BACKGROUND OF THE INVENTION

This invention relates to position finely adjusting apparatus which is used to accurately position a workpiece which is required to be worked precisely, for example. Such accurate positioning apparatus are required for precisely aligning the positions of a mask and a wafer that are used to prepare large integrated circuits by concurrent exposure of electron beams, X-rays or ion bombardments for accurately positioning the mask for forming a pattern thereon.

In recent years, the density of the large integrated circuit is increasing with the result that the accuracy of forming a pattern on a wafer should be increased to an order of 0.1 micron or less from an order of microns required by conventional transistor integrated circuits.

Such highly accurate working is not possible with conventional photoetching technique due to diffraction of the exposure light and other reasons. Accordingly, the photoetching technique has been replaced to a large extent by a scanning type electron microscope system utilizing an electron beam having a high resolution and a long focal distance. However, according to this system, a pattern is formed on a wafer by utilizing an extremely fine electron beam so that its working time is long and such system is not suitable for mass production. One example of the scanning type electron microscope system is described in D. R. Heriott, R. J. Collier et al. paper "EBES; a Practical Electron Lithographic System" on pages 385 to 392 of IEEE Taransaction Electron Device, July, 1975, Vol. ED-22, No. 7. To solve this problem it has been proposed to use an improvedmethod wherein a scanning type electron microscope system having a high working accuracy is used to firstly prepare a master pattern, and then concurrently expose and bake a pattern on a wafer by using the master pattern and an electron beam, ultraviolet ray, X-ray or ion bombardment working technique thereby improving productivity. With this method, the accuracy of forming the pattern on the wafer is determined by the accuracy of the mechanism utilized to align the relative position of the mask and the wafer. To attain this object, it is necessary to use a feed adjusting mechanism having a stepping accuracy of at least 0.01 micron or less. Since, patterns are generally baked repeatedly on the same wafer about 6 to 8 times, when one takes into consideration an accumulated error of the positioning operations it is necessary to improve the accuracy of feeding to 0.03 micron ($3 \times 10^{-6}$ cm) or more.

According to one method of determining the relative position between a mask and a wafer, as shown in FIG. 1 a plurality of reference marks 13 and 14 are formed on the mask 11 and the wafer 12, respectively, and the relative positions of the wafer and mask are adjusted in the X and Y axes directions as well as in the rotational direction (angle $\theta$) by positioning means such that each light beam or X-ray passes through aligned reference marks 13 and 14. The light beams are received by light receivers 16 to control the positioning means. To this end, the positioning means is required to finely adjust the position of the mask 11 or wafer 12. Further, the accuracy of positioning must satisfy the value described above in three directions.

In the case of the concurrent exposure method, in order to limit as far as possible the spreading of the electron beams or X-rays so as to improve the baking accuracy of the pattern, it is necessary to decrease as far as possible the spacing between the wafer and the mask and to maintain them in exact parallel relationship. Especially, in the concurrent X-ray exposure for a plurality of chips on the wafer, the relative spacing should be several microns. Further, in mass production it is difficult to maintain the wafer and mask in exact parallel relationship so that the positioning mechanism is required to be finely adjustable in the Z axis direction in addition to the X and Y axis directions and rotation $\theta$.

There was no positioning mechanism that can satisfy these requirements, but the mechanism shown in FIG. 2 may have some possibility. One example of such mechanism is described in Offenlegungs Schrift: ff 1772314, published in Germany.

The positioning mechanism shown in FIG. 2 comprises a rectangular table 20 for supporting a wafer 12. At four corners of the table 20 are formed projections 20a, 20b, 20c and 20d for securing cylindrical piezoelectric elements 21 through 24, respectively, which are driven to align the reference mark 14 on the wafer 12 with the reference mark 13 on the mask 11, such alignment being made by adjusting the relative position in the directions X, Y and $\theta$ under the supervision of the light beam detectors 25. The range of adjustment of this mechanism is about 10 microns so that in order to position beforehand the wafer in this range of adjustment, a highly accurate microstage is combined with the positioning mechanism.

With this positioning mechanism where piezoelectric elements 21 and 23 in the direction X are driven for moving the wafer 12 in the direction X, since piezoelectric elements in the direction Y are also connected to the table 20, the table will be influenced by the mechanical impedance of these elements so that it is extremely difficult to move straightly the wafer 12 in the direction of X axis. Similar difficulty also occurs when the piezoelectric elements 23 and 24 in the direction Y are driven. This means that it is difficult to position the wafer through a desired path. Accordingly, it is not only impossible to move the wafter to the absolutely correct position but also impossible to adjust the movement of the wafer to a next predetermined position with reference to a selected point. Accordingly, it is extremely difficult to adjust the position at a high accuracy of the order of 0.1 micron. For the same reason, this mechanism cannot move the table 20 in a straight line in each direction for detecting the marks on the wafer and the mask. Accordingly, when one tries to move the wafer 12 obliquely by simultaneously driving it in X and Y directions the wafer moves along a complicated path that cannot be controlled readily. Further undesirable strains are applied to the wafer 12, table 20 and piezoelectric elements 21 through 24 and in the extreme case, the piezoelectric elements would be ruptured. When the mechanical coupling between the piezoelectric elements and the table 20 is decreased for the purpose of preventing damage to the piezoelectric elements the coupling becomes loose or may cause a backlash. Due to the low sensitivity of the cylindrical piezoelectric elements utilized in this mechanism, in order to realize a range of adjustment of the order of 10 microns it is necessary to increase the length of the cylindrical elements to about several 10s cm, or to decrease the diameter to about 0.3 mm or to increase the driving voltage of the piezoelectric elements (in terms of electric field, higher than 3000 V/cm or more). It is difficult to make long and thin the piezoelectric elements due to the avaialable space and mechanical strength. On the other hand when the driving voltage is increased the hysteresis characteristic inherent to the piezoelectric element becomes excessive thus rendering it more difficult to perform accurate control. For these reasons, with the mechanism shown in FIG. 2, it has been almost impossible to perform position adjustment with an accuracy of less than 0.1 micron.

FIG. 3 shows another example of a prior art position adjusting mechanism described in French Pat. No. 2178640. In this mechanism, X and Y stages 26 and 27 are movably stacked on a base plate 25. The stages 26 and 27 are driven in X and Y axes by a motor not shown and a coarse positioning is done by a laser interferometer 28. As shown, Y stage 27 is mounted on X stage 26 and a microtable 30 driven by an electromagnet 29 is supported on the Y stage 27 by means of leaf springs 31. Fine adjustments of the position is provided by utilizing the balance between the attractive force of the electromagnet 29 and the reaction of the leaf springs 31.

With this mechanism, however, since the relationship between the attractive force of the electromagnetic and the body to be attracted thereby, namely the table 30, is nonlinear, fine position adjustments in the X and Y directions are also nonlinear. Accordingly, the control system for effecting such adjustment is extremely complicated. Especially, when the control speed is increased the control becomes unstable due to its nonlinear nature. By the construction shown in one embodiment of said French patent it is impossible to make high the resonance frequency. Moreover since a stacked construction is used the motion of the mechanism is unstable. Also in this construction, mutual interference between the driving forces in respective directions is inevitable. Although such mechanism can be used to form a pattern of low density, it cannot be used to effect at a high speed and at a high accuracy the alignment of the positions of the mask and wafer for the purpose of increasing the productivity.

In order to use the linear portion only of the control characteristic for the purpose of eliminating the problem caused by the nonlinear characteristic the distance between the electromagnet and the body attracted thereby may be used. However, as the attractive force decreases in proportion to the square of the distance, it is necessary to increase the size of the electromagnet or to increase the current flowing therethrough. This of course increases the size of the apparatus.

The mechanism utilizing an electromagnet, or an electromagnetic transducer has a large magnetic leakage and cannot provide an accurate control having an accurcy of less than 0.1 micron due to the mechanical or electrical interference between transducers for respective axes. Especially, when a vibration is applied for detecting the marks in the concurrent exposure system it is extremely difficult to align the relative position of the mask and the wafer where the mutual interference caused by the magnetic leakage exists.

In order to eliminate the effect of the magnetic leakage it is necessary to sufficiently separate the transducers for avoiding the mutual interference therebetween, thereby increasing the size of the mechanism.

Magnetostrictive or electrostrictive electromechanical transducers may be used for eliminating inherent problems of the electromagnetic transducers, but the former cannot be used for performing the position adjustment at high accuracies due to its low sensitivity, whereas the latter presents problems similar to those of the mechanism shown in FIG. 2 so that it cannot be used.

Even when the use of the prior art mechanisms described above is limited to a mere feed control and when the feed plane is limited to one plane including X and Y axes and angle θ it is impossible to operate with accuracies of less than 0.1 micron and at high speeds. Further, the use of a vibration for correctly detecting the position alignment of the wafer and the mask is almost impossible. Admitting that a fine position alignment is possible with the prior art mechanism (neglecting the defect of decreasing the accuracy) the range of the possible adjustment of the prior art mechanism is about 5 microns. Further, a high accuracy microstage is necessary to preset the accuracy in this range. This not not only requires a large and expensive mechanism but also requires a multistate control, thus increasing the cost of the mechanism. Where extremely high accuracies are required for not only X, Y and θ directions but also for Z axis direction as in the case of the X-ray concurrent exposure such mechanism can never be used.

SUMMARY OF THE INVENTION

Accordingly, it is the principal object of this invention to provide a novel apparatus capable of finely adjusting the position of an object at high accuracies and at high speeds suitable for mass production.

Another object of this invention is to provide novel apparatus for finely adjusting a position and capable of eliminating the mutual interference between driving means for respectively directions and for a rotary motion.

Still another object of this invention is to provide apparatus for finely adjusting a position at high accuracies only in a desired direction.

A further object of this invention is to provide improved apparatus for finely adjusting a position at high speeds and high accuracies without accompanying hysteresis.

Still a further object of this invention is to provide novel apparatus for finely adjusting a position capable of adjusting at high accuracies the inclination of the object with respect to the X, Y and Z axes direction, the angular rotation in X-Y plane and with respect to Z axis.

Another object of this invention is to provide apparatus for finely adjusting a position having a relatively compact construction.

Another object of this invention is to provide novel apparatus for finely adjusting a position capable of cancelling out the effect of the magnetic flux acting upon the workpieces mounted on the respective stages.

Still another object of this invention is to provide apparatus for finely adjusting a position constructed not to create parasitic vibrations at respective stages where they are moved at high speeds or subjected to high speed vibrations.

Another object of this invention is to provide novel apparatus for finely adjusting a position which includes a source of drive which does not move a workpiece to other directions when it is rotated.

A further object of this invention is to provide improved apparatus for finely adjusting a position capable of eliminating the mutual coupling between drive sources utilized to adjust the inclination of the workpiece.

Yet another object of this invention is to provide apparatus for finely adjusting a position capable of detecting and correcting the movement of a stage when working a workpiece carried thereby.

Another object of this invention is to provide apparatus for finely adjusting a position which is suitable for concurrent exposure utilized to prepare large integrated circuits.

Yet another object of this invention is to provide apparatus for finely adjusting a position capable of attaining sufficiently high accuracies with an open loop control.

According to one aspect of this invention there is provided position finely adjusting apparatus comprising a stationary frame, first and second movable stages respectively arranged to be movable along first and second axes intersecting at right angles in a plane, a plurality of dynamic type electro-mechanical transducers mounted on respective axial ends of respective stages, a first resilient supporting member for supporting the first stage on the stationary frame to be movable in the direction of the first axis, a second resilient supporting member mounted on the first stage for supporting the second stage to be movable in the direction of the second axis, and means mounted on the second stage for supporting an object to be adjusted.

According to another aspect of this invention there is provided position finely adjusting apparatus comprising a pair of annular stationary frames, first and second movable stages respectively arranged to be movable along first and second axes respectively intersecting at right angles in a plane, a plurality of dynamic type electromechanical transducers mounted on respective axial ends of respective stages, and first and second pairs of annular resilient supporting members respectively supporting the first and second movable stages, said first and second pairs of the annular resilient supporting members being provided with openings respectively, said first movable stage being secured to the edges of the openings of the first one of the annular resilient supporting members, the outer edges of the first pair of the annular resilient supporting members being respectively secured to the stationary frames, said second movable stage being secured to the edges of the openings of the second pair of the annular resilient supporting members, and the outer edges of the second pair of annular resilient supporting members being secured to the first movable stage; and a platform mounted on the second movable stage for supporting an object to be adjusted.

According to still another aspect of this invention, there is provided position finely adjusting apparatus comprising a stationary frame, first and second movable stages respectively arranged to be movable along first and second axes intersecting at right angles in a plane, a plurality of dynamic type electro-mechanical transducers mounted on respective stages, a first resilient supporting member for securing the first movable stage to the stationary frame to be movable in the direction of the first axis, a second resilient supporting member mounted on the first movable stage for supporting the second movable stage to be movable in the direction of the second stage, a supporting post mounted on the second movable stage and extending in the direction of a third axis perpendicular to the point of intersection of the first and second axes, a rotary body rotably mounted on the supporting post, a plurality of bending type electro-mechanical transducers disposed between the supporting post and the rotary body for rotating the same, and a platform mounted on the rotary body for supporting a body to be adjusted According to a further aspect of this invention there is provided position finely adjusting apparatus comprising a stationary frame, first and second movable stages respectively arranged to be movable along first and second axes intersecting at right angles in a plane, a plurality of dymanic type electro-mechanical transducers mounted on respective axial ends of respective stages, a first resilient supporting member mounted on the starionary frame for supporting the first movable stage to be movable in the direction of the first axis, a second resilient supporting member mounted on the first movable stage for supporting the second stage to be movable in the direction of the second axis, a plurality of bending type-electro-mechanical transducers with one ends secured to the second movable stage to extend in the radial direction with respect to a third axis perpendicular to the point of intersection of the first and second axes, the transducers being bendable about the third axis, and means supported by the other ends of the bending type electro-mechanical transducers for supporting an object to be adjusted.

According to still further aspect of this invention there is provided position finely adjusting apparatus comprising a stationary frame, first and second movable stages respectively arranged to be movable along first and second axes intersecting at right angles in a plane, a plurality of dynamic electro-mechanical transducers mounted on respective axial ends of respective stages, a first resilient supporting member supported by the stationary frame for supporting the first movable stage to be movable in the direction of the first axis, a second resilient supporting member mounted on the first movable stage for supporting the second movable stage to be movable in the direction of the second axis, a supporting post mounted on the second movable stage and extending in the direction of a third axis perpendicular to the point of intersection of the first and second axes, a rotary body rotatably mounted on the supporting post, a first bending type electromechanical transducers disposed between the supporting post and the rotary member for rotating the rotary body, a plurality of second bending type electro-mechanical transducers mounted on the rotary body to extend in the radial direction with respect to the supporting post, the second bending type electro-mechanical transducers being bendable about the third axis, and means supported by the bending type transducers for supporting an object to be adjusted.

BRIEF DESCRIPTION OF THE DRAWINGS

Further objects and advantages of the invention can be more fully understood from the following detailed description taken in conjunction with the accompanying drawings in which:

FIG. 4A is a diagram showing the relationship between X, Y and Z axes and various components of the apparatus;

FIG. 12 is a block diagram showing the controlling circuitry for the driving system of the position adjusting apparatus shown in the embodiment described above.

DESCRIPTION OF THE PREFERRED EMBODIMENT

In the following embodiment the apparatus is used to adjust the position of a semiconductor wafer utilized in large integrated circuits and the mechanism and electric circuit for concurrently exposing the wafer by using a mask are illustrated.

Figure 4:
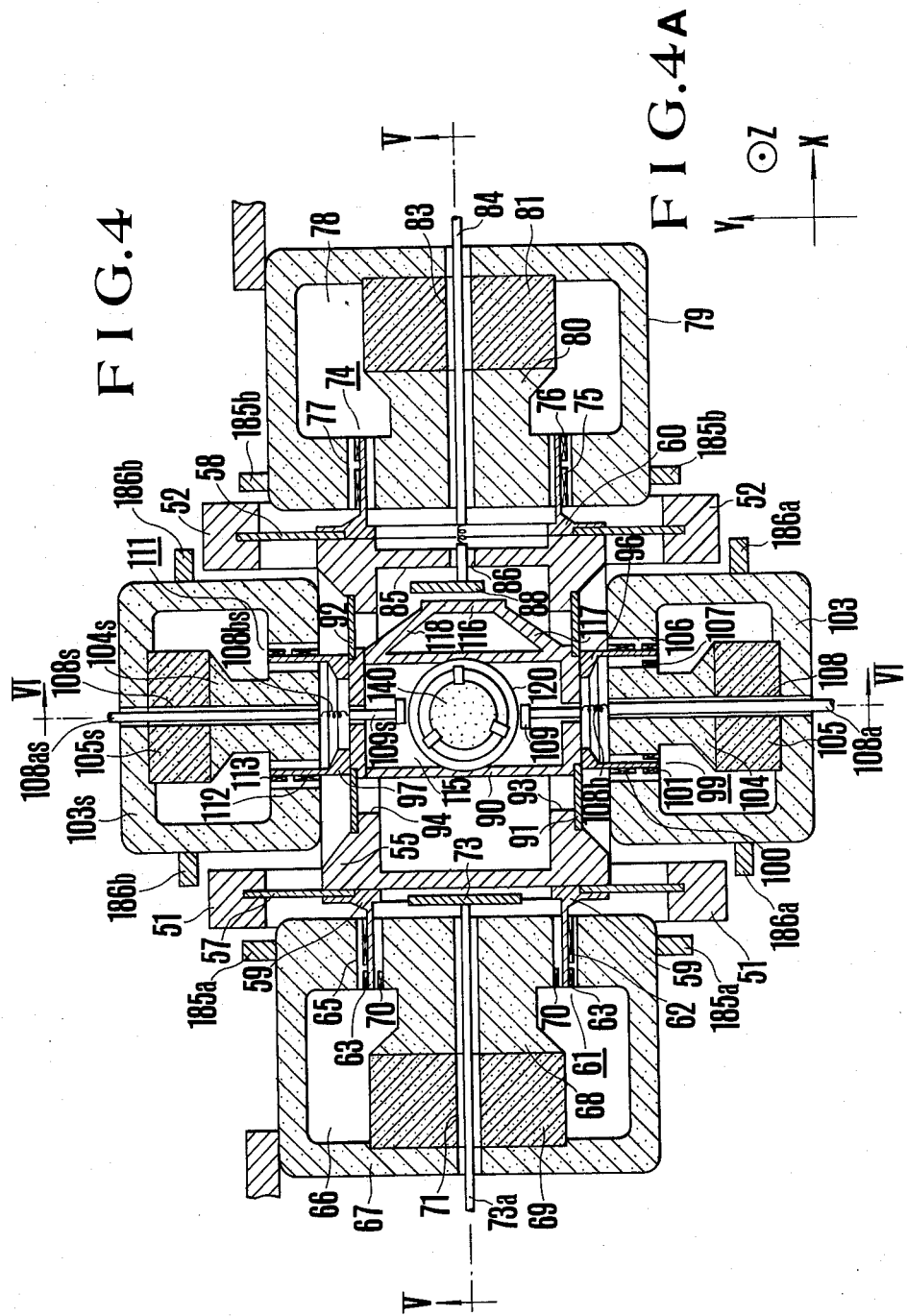
FIG. 4 is a plan view, mostly in section, showing one embodiment of the position adjusting apparatus embodying the invention.

FIG. 4 shows a plane view, mostly in section, of the novel position finely adjusting apparatus with a mask approaching device removed.

Figure 5:
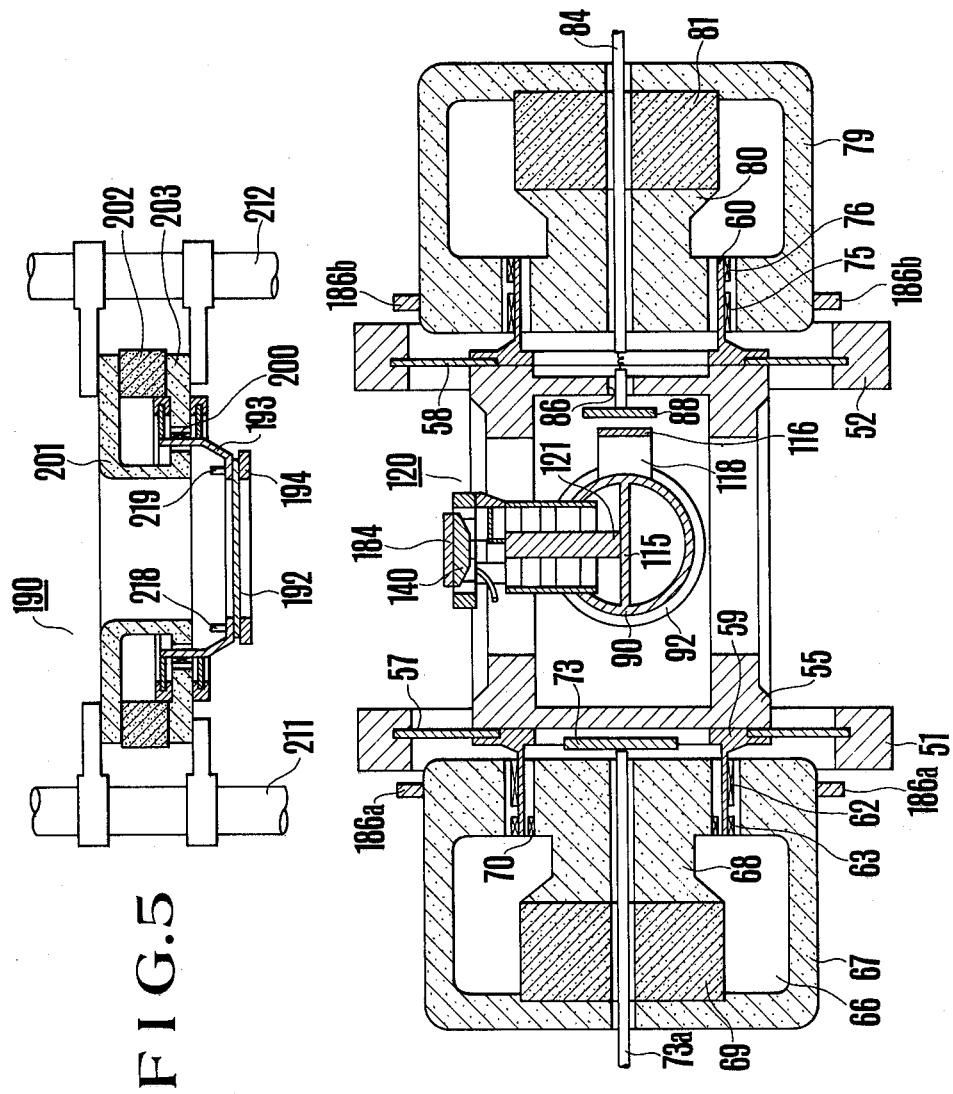
FIG. 5 is a sectional view of the apparatus shown in FIG. 4 taken along a line V — V and incorporated with a mechanism for aligning the positions of a wafer and a mask.
Figure 6:
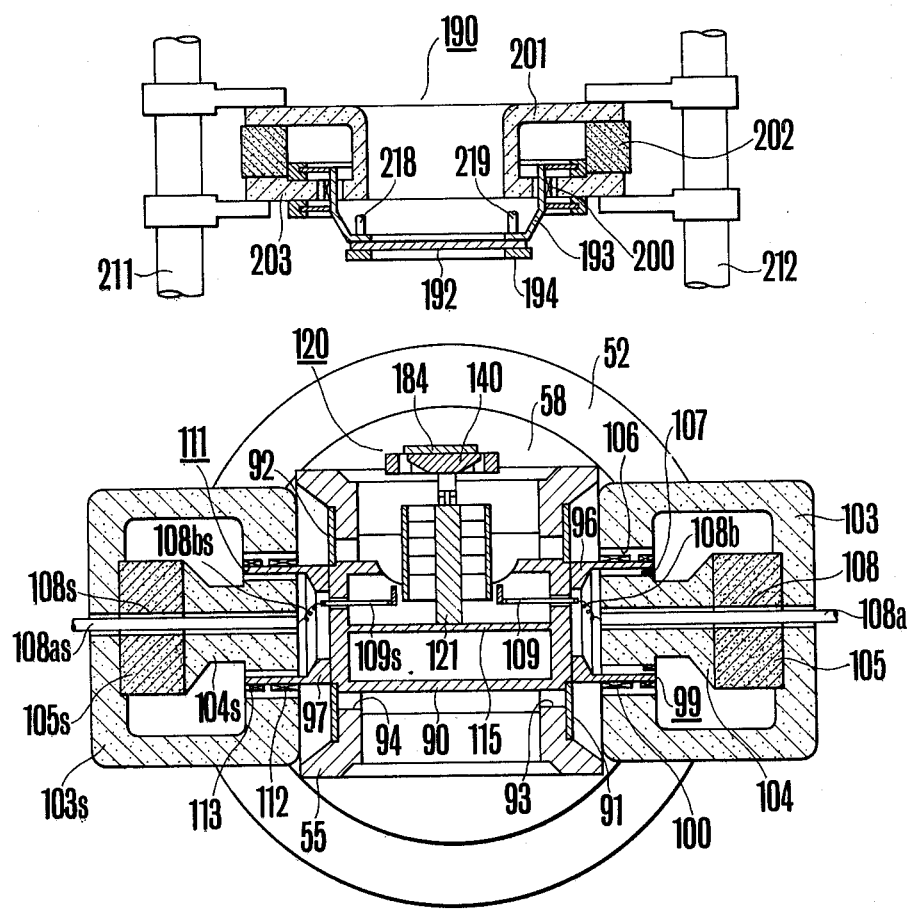
FIG. 6 is a sectional view of the apparatus shown in FIG. 4 taken along a line VI—VI and also incorporated with the mechanism for aligning the positions of the wafer and the mask.

With reference to FIGS. 4, 5 and 6, for the sake of easy understanding of this invention, main component elements will be described consecutively.

STATIONARY FRAME

In this example, the stationary frame comprises two ring shaped stationary frames 51 and 52 nade of non-magnetic material and are mounted on a stationary platform, not shown, with a definite spacing and along an axis, for example X. In this example, the directions of respective axes are selected as shown in FIG. 4A.

OUTER CASING MOVABLE IN THE DIRECTION OF X AXIS

An outer casing 55 movable in the direction of X axis (hereinafter termed the X stage) has the form of a substantially rectangular box and disposed between the ring shaped stationary frames 51 and 52 on the same axis X. The casing 55 is equally spaced from the stationary frames 51 and 52. The opposite ends of X stage 55 are closed, and on the outer walls thereof are secured the inner peripheries of annular elastic supporting members (annular vibrating diaphragms) 57 and 58, the entire outer peripheries of the vibrating diaphragms being secured to the inner walls of the stationary frames 51 and 52. Consequently, the X stage 55 is suspended by the frames 51 and 52 via the annular vibrating diaphragms which are made of a non-magnetic material such as metallic titanium, 18-8 stainless steel having a small linear expansion coefficient, a high Youngs modulus, a high tensile strength, a high yielding point and an extremely high stiffness. It is to be understood that the X stage 55 is constructed to have sufficiently high rigidity so as to act as a perfect rigid body in the direction of X axis when the X stage is moved like a piston along X axis as will be described later. Annular metal frames 59 and 60 extend coaxially from both ends of the X stage 55 in the direction of X axis. Various coils to be described later are wound upon the metal frames 59 and 60.

More particularly, a driving coil 62 forming a portion of a dynamic electro-mechanical transducer 61 for providing a zero frequency feeding along the X axis is wound upon metal frame 59.

On the outside and adjacent to the driving coil 62 is disposed an X speed detecting coil 63 which detects the feed speed in the direction of X axis. It is preferable to form a slit, not shown, in the metal frame 59 for the purpose of preventing a secondary current which is induced in the frame 59 when it moves and affects the output voltage from the speed detecting coil 63.

In addition to the driving coil 62 described above, the dynamic electro-mechanical transducer 61 comprises a cup shaped outer pole member 67 having a circular opening 65 and an internal cavity 66, an inner pole member 68 disposed in the circular opening 65 and spaced therefrom a definite distance, and a cylindrical permanent magnet 69 disposed between the outer and inner pole members 67 and 68 in coaxial relation with the inner pole member 68 along the X axis. These component parts are coaxial with the X stage 55 to form an annular air gap between the inner wall of the opening 65 and the inner pole member 68 in which is disposed the metal frame 59 carrying the driving coil 62 to be movable freely. A compensating coil 70 having substantially the same coefficient of spring is mounted on the pole surface of the inner pole member 68 at a position confronting the X speed detecting coil 63. The coils 63 and 70 are connected oppositely. As a result, it is possible to prevent the decrease in the speed detection accuracy caused by a voltage induced in the speed detecting coil 63 when the driving current flowing through the driving coil 62 for the zero frequency feeding in the direction of X axis varies as the control speed increases.

A through hole 71 is formed in the direction of X axis through the inner and outer pole members 68 and 67 and the permanent magnet 69. A terminal member 73a supporting an pole 73 in a space between the inner electrode member 68 and the X stage extends through the opening 71. The purpose of the electrode 73 is to detect the variation in the electrostatic capacitance caused by the movement of the X stage in the direction of X axis for measuring a small displacement of the X stage 55 in the direction of X axis.

A driving coil 75 is wound upon the metal frame 60. The coil 75 comprise a portion of a dynamic electromechanical transducer 74 for superposing a vibration in the X axis direction upon the vibration displacement of the X stage. On the outside and adjacent to the driving coil 75 is mounted a damping coil 76 for preventing transient vibrations which occur at the time of an external disturbance or control. The damping coil 76 is short circuited by an external circuit or connected to the X speed detecting coil 63 throgh an external control circuit. For the purpose of applying an effective damping action to the metal frame 60 no slit is formed as in the case of the metal frame 59.

In addition to the driving coil 75, the dynamic electro-mechanical transducer 74 is provided with a cup shaped outer pole member 79 having a circular opening 77 and an inside cavity 78, an inner pole member 80 disposed in the opening 77 with a definite air gap therebetween and a cylindrical permanent magnet 81 disposed between the inner and the outer pole members 80 and 79 coaxially with the inner pole member. These members are disposed to be coaxial with the X stage 55, and the metal frame 60 carrying driving coil 75 is movably disposed in the air gap between the inner wall of the opening 77 and the inner pole member 80. A through hole 83 extending in the direction of X axis is formed through the inner and outer pole members 80 and 79 and the permanent magnet to receive a terminal member 84 of a T shaped electrode 88 disposed in the space between the X stage 55 and the end plate 85. The terminal member of the electrode 88 extends through an opening 86 of the end plate 85 and is conneted to the terminal member 84. Electrode 88 is used to measure the small displacement of a Y stage to be described later in accordance with the variation of electrostatic capacitance which occurs when the Y stage is moved. As shown in FIG. 4, the Y stage is positioned at a position displaced in the direction of Y axis from the confronting portion of the X stage as will be described later for the purpose accurately determining a small displacement in the direction of Y axis.

OUTER CASING MOVABLE IN THE DIRECTION OF Y AXIS

The outer casing 90 movable in the direction of Y axis (hereinafter termed a Y stage) generally has a cylindrical form, and to the opposite end plates of the Y stage 90 are secured the inner edges of annular resilient supporting members or annular vibrating diaphragms 91 and 92, the outer edges thereof being secured to the X stage 55. More particularly, openings 93 and 94 having a larger diameter than the outer diameter of the Y stage 90 are formed in the direction of Y axis throgh the side walls of the X stage 55 which extends in the direction of X axis and the outer peripheries of the vibrating diaphragms 91 and 92 are secured to the peripheries of the openings 93 and 94, thereby suspending the Y stage 90 from the X stage 55. The vibrating diaphragms 91 and 92 are made of the same material as the vibrating diaphragms 57 and 58 that hand the X stage 55. However, the thickness of the vibrating diaphragms 91 and 92 are such that their stiffness will be lower by one order of magnitude than that of the vibrating diaphragms 57 and 58.

Annular metal frames 96 and 97 concentric with Y stage 90 extend in the direction of Y axis from the opposite ends of the Y stage 90 for carrying a plurality of coils as will be described later in detail.

More particularly, a driving coil 100 that forms a portion of a dynamic electro-mechanical transducer 99 for effecting a zero frequency feeding in the direction of Y axis is wound on the metal frame 96. On the outside and adjacent to the driving coil 100 is wound on a Y speed detecting coil 101 for detecting the feed speed in the direction of Y axis. Thus, the arrangement and function of the coils would on the metal frame 96 are the same as those of the coils wound on the metal frame 59 of the X stage 55. Similar to the electro-mechanical transducer 61 of X stage 55 the dynamic electro-mechanical transducer 99 comprises an outer pole member 103, an inner pole member 104 and a permanent magnet 105 and has the same construction as that of the transducer 61. The metal frame 96 is movably disposed in the air gap 106 between the inner and outer pole members 104 and 103 and a compensating coil 107 having a substantially the same force coefficient as that of the Y speed detecting coil 101 is wound on the inner pole member 104 at a position confronting the Y speed detecting coil 101. Coils 107 and 101 are electrically connected in opposition to the outside of the mechanism.

A through opening 108 is formed through the inner and outer pole members 104 and 103 and the permanent magnet 105 to extend in the direction of Y axis for receiving a terminal member 108a which is connected through a lead wire 108b to a T shaped electrode 109 contained in the Y stage 90. The electrode 109 is used to measure the amount of the angular displacement of a rotary body (to be described later) caused by the variation in the electrostatic capacitance which occurs when the rotary body rotates.

A driving coil 112 which forms a portion of a dynamic electro-mechanical transducer 111 is wound about the metal frame 97. The transducer 111 is used to superpose a displacement in the direction of Y axis on the vibration of the Y stage 90 for the purpose of detecting the marks on the wafer and the mask. A damping coil 113 for preventing a transient vibration which occurs at the time of an external disturbance or control is wound adjacent to the driving coil 112. Like the damping coil 76 of the transducer 74, the damping coil 113 is short circuited by an exernal circuit or connected to the Y speed detecting coil 101 via a control circuit, not shown. Coils 112 and 113 are disposed on the periphery of the metal frame 97 in the same manner as the coils mounted on the metal frame 60 and operate in the same manner.

Since other component parts of the dynamic electro-mechanical transducer 111 are identical to those of the transducer 99 these component parts are designated by reference numerals for the corresponding component parts of the transducer 99 with added subscripts "s". Electrodes 109 and 109s are asymmetrically disposed with reference to the center line of the rotary body 120, as shown in FIG. 4 and are electrically connected such that their outputs are added to each other.

A flat plate 115 (best seen in FIG. 6) parallel with the X axis is disposed at the center of Y stage 90 along or near the Y axis, and the portion of the stage immediately above the flat plate is removed to form opening 94. A metal plate 116 is mounted on the Y stage 90 by arms 117 and 118 to oppose the electrode 88 mounted on the X stage 55.

ROTARY BODY ROTATABLE ABOUT Z AXIS

Figure 7:
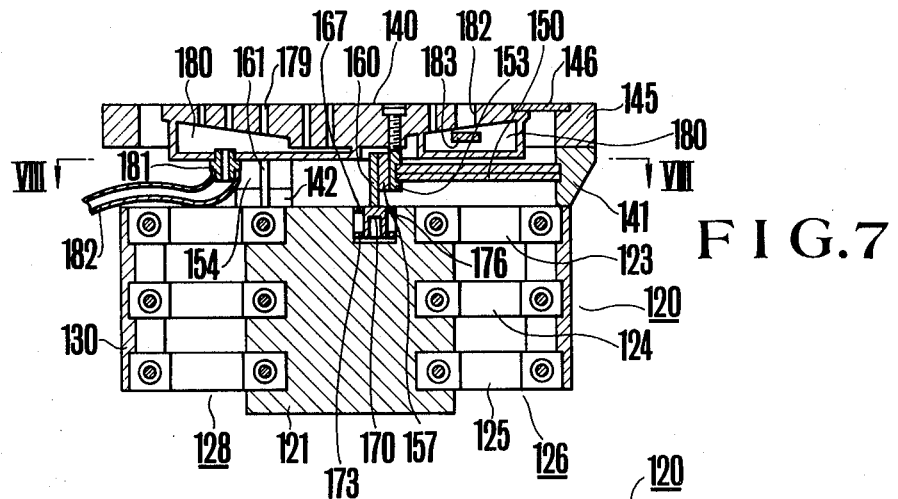
FIG. 7 shows a longitudinal sectional view showing a workpiece supporting platform and a rotary body comprising a part of the apparatus shown in FIGS. 4 to 6.
Figure 8:
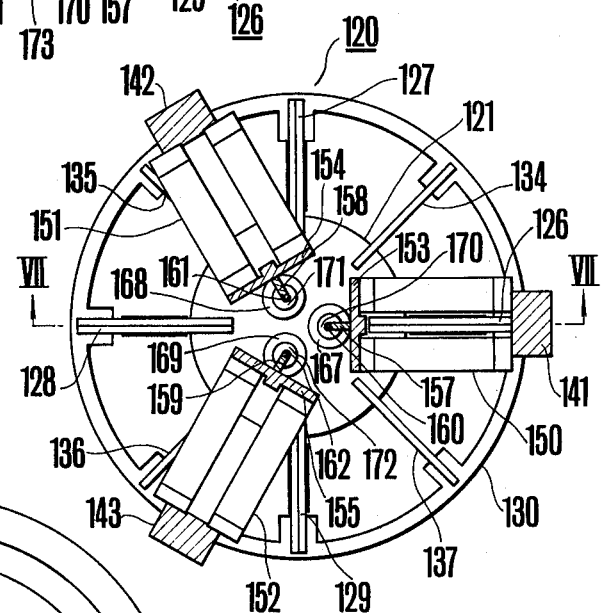
FIG. 8 is a sectional view of the apparatus shown in FIG. 7 taken along a line VIII—VIII.
Figure 10:
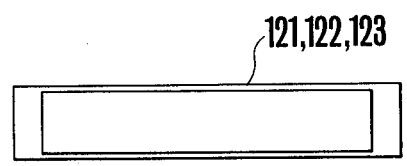
FIG. 10A is a plan view showing one example of the construction of an electro-striction element shown in FIG. 7.
FIG. 10B is a side view of the electro-striction element shown in FIG. 10A.
Figure 10:
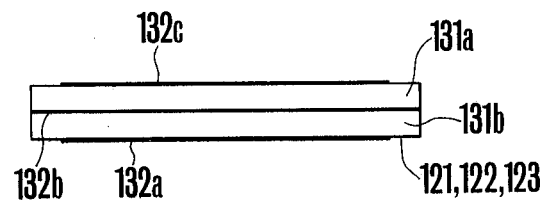

The rotary body 120 is mounted on a vertical supporting post 121 (See FIG. 5.) at the center of flat plate 115 and extending in the direction of Z axis perpendicular to X and Y axes. FIGS. 7 and 8 show the detail of the rotary body 120. 4 sets of bendable electro-mechanical transducers 126 – 129 extend radially from the supporting post 121 at an equal angular spacing. Each set of the transducers comprises three bimorph type electrostriction elements 123, 124 and 125 equally spaced along the Z axis. The outer ends of the transducers 126, 127, 128 and 129 are secured to the inner wall of a cylinder 130. Each bimorph type electrostriction element has a construction as shown in FIGS. 10A and 10B and comprises two superposed rectangular plates 131a and 131b made of ferroelectrostriction material such as zirconium titanate lead and electrodes 132a, 132b and 132c applied to the opposite surfaces of the rectangular plates 131a and 131b for applying polarizing and driving voltages. The reason that each transducer comprises four axially spaced electrostriction elements is to use elongated elements that can bend in the direction of rotation, to apply uniform torque to the rotary body in the upward and downward directions and to increase the overall torque. The number of the electrostriction elements may be 3 or 4 or more. In the example, 4 transducers are disposed in the radial direction for the purpose of increasing the overall torque over that provided by a single transducer and assuring stable operation by creating torques in the same direction that is in the circumferential direction. Equally spaced four reinforcing resilient plates 134 – 137 are arranged in the radial direction between the supporting post 121 and the cylindrical body 130 for the purpose of ensuring the rotary attitude of the cylindrical body. These resilient plates are disposed between adjacent transducers. The resilient plates 134 – 137 are made of a material having similar property as the annular vibrating diaphragms and are constructed to compensate for the hysteresis characteristics of the transducers 126 through 129, not to decrease the resonance frequencies thereof, and not to apply longitudinal force that is gravity to the transducers which subjects the same to strain. The bending type transducers 126 through 129 are disposed such that they will bend in the same direction when driving voltage is applied thereto. With such construction it is easy to produce an angular displacement of the order of 10 microns.

At least four bending type transducers 126 through 129 and at least four reinforcing resilient plates 134 through 137 are arranged to align with the axes of displacements of the X and Y stages 55 and 90, that is X, Y and Z axes. With this construction, the cylindrical body 130 will not be displaced and deformed when the supporting post 121 is moved toward the X stage 55 or Y stage 90 so that the axis of rotation of the cylindrical body 130 can accurately follow the movement of the Y stage. The length of the cylindrical body 130 is made long as far as possible so that the upper surface of the cylindrical body rotates in the horizontal plane with a desired accuracy when the driving voltage is impressed upon the transducers 126 through 129 for bending them. For the purpose of minimizing the elongation and contraction in the direction of Z axis of the transducers 126 through 129 corresponding electrostriction elements of respective transducers are arranged on the same plane whereas the width of the reinforcing resilient plates 134 through 137 are made to be equal to the axial length of the cylindrical body 130.

Platform for Mounting Workpiece and Mechanism for Adjusting Inclination thereof

Figure 9:
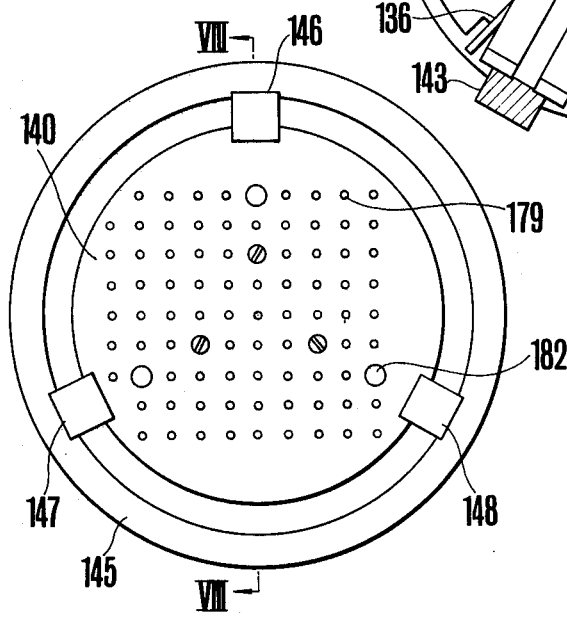
FIG. 9 is a plan view showing the workpiece supporting platform.

The construction of the platform 140 for mounting a workpiece is also shown in detail in FIGS. 7, 8 and 9. The upper edge of the cylindrical body 130 of the rotary body 120 is provided with three upright projections 141, 142 and 143 for supporting an annular ring 145, provided with inwardly projecting stabilizing resilient plates 146, 147 and 148 which are adapted to support the platform 140.

The ends of bending type electrostriction transducers 150, 151 and 152 are secured to respective projections 141, 142 and 143 with the electrode surfaces maintained in the horizontal direction for adjusting the height in the X axis direction and the inclination, each transducer comprising pair of electrostriction element juxtaposed in a horizontal plane. The other ends of the transducers are connected to lugs 153, 155 and 154 depending from the lower surface of the platform 140. Each lug has a high stiffness in the vertical or Z axis direction but relatively low stiffness in the horizontal direction. One sides of resilient segments 157, 158 and 159 are secured to one side of respective lugs and rigid shafts 160, 161 and 162 are secured to the other sides of the resilient segments, respectively. The lower ends of the shafts 160, 161 and 162 are connected to circular resilient members 167, 168 and 169 received in recesses 163, 164 and 165 respectively on the upper surface of the supporting post 121 and also to rigid cylinders 170, 171 and 172 received in the openings of respective resilient members 167, 168 and 169. The lower ends of the cylinders 170, 171 and 172 are secured to resilient seats 173, 174 and 175, respectively (only 173 is shown) which are secured to the inner walls of the recesses 176, 177 and 178 (only 176 is shown) formed on the upper surface of the supporting post 121.

Resilient members 167—167, 173-175 and resilient segments 157-159 constitute a resilient seat for the workpiece supporting platform 140, the seat acting to absorb unequal stresses between three sets of the bending transducers 150, 151 and 152 which are formed when the inclination of the platform is corrected as well as unequal stresses caused by uneven sensitivity of the elements. Accordingly, when the resilient seat is combined with the bending type transducers 150, 151 and 152 it is possible to provide fine adjustment of the height and inclination of the platform 140.

The three stabilizing resilient plates 146, 147 and 148 which support the periphery of the workpiece supporting platform 140 prevent the same from becoming unstable caused by a large movement of the periphery of the platform which occurs when the bending type transducer 150, 151 and 152 operate to adjust the inclination. These resilient plates further ensure the follow-up characteristic of the platform to the movements of the cylindrical body 130, supporting post 121 and X and Y stages 55 and 90.

The platform 140 is provided with a plurality of fine suction holes 179 for attracting the workpiece under a low pressure. These suction holes are communicated with a source of reduced pressure through a back chamber 180, a nipple 181 and a tube 182. To improve adhesion of the workpiece, the upper surface of the platform 140 is mirror finished.

Further, the platform 140 is provided with a plurality of perforations 182 for passing a light beam or X ray utilized to detect the marks on the wafer, and just beneath these perforations are positioned a plurality of light receivers 183.

Although not shown in the drawing, the cylindrical body 130, the platform 140 for supporting the workpiece, and a portion of the Y stage constitute a displacement measuring electrode for measuring the displacement in the vertical direction (Z axis direction) and the inclination of the Y stage 90, and the construction of this electrode is similar to those for measuring the displacements in the directions of X and Y axes.

Figures 1, 2, 3:
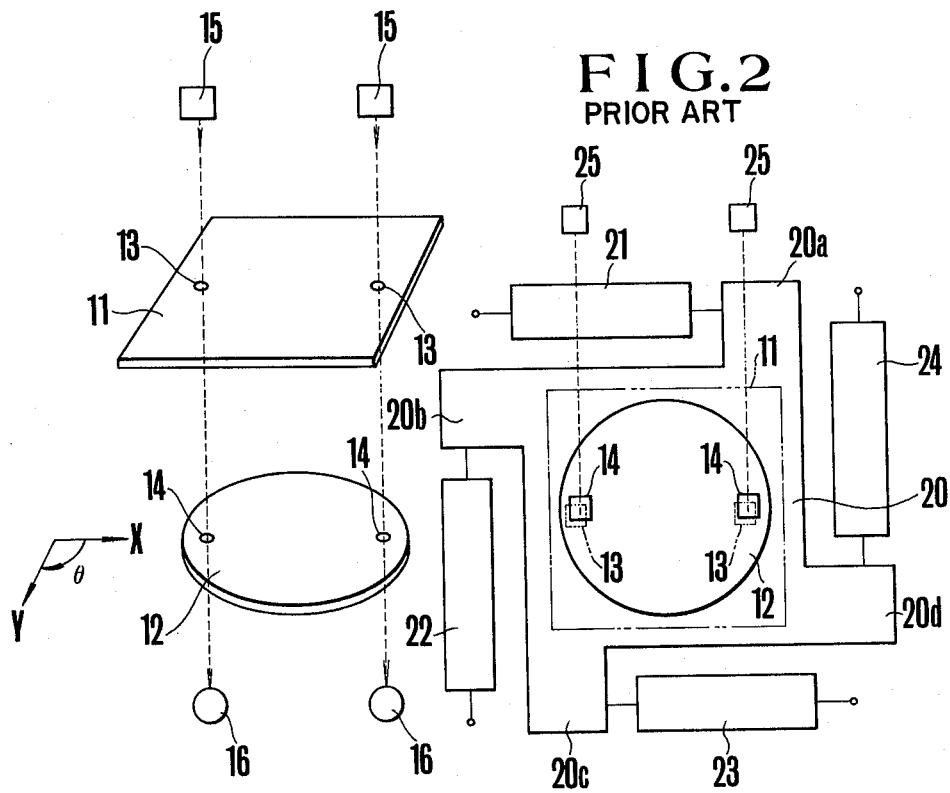
FIG. 1 is a perspective view showing the principle of aligning the positions of a wafer and a mask.
FIG. 2 is a plan view showing one example of a prior art position aligning mechanism.
FIG. 3 is a side view showing another example of a prior art position aligning mechanism.

In FIGS. 5 and 6 the wafer mounted on the platform 140 is designated by a numeral 184 which has a well known shape and applied with marks as shown in FIG. 1. In FIGS. 4 and 5, stops 185a, 185b, 186a and 186b are provided for limiting the movement of the transducers in the directions of respective axes.

MASK APPROACHING DEVICE

Figure 11:
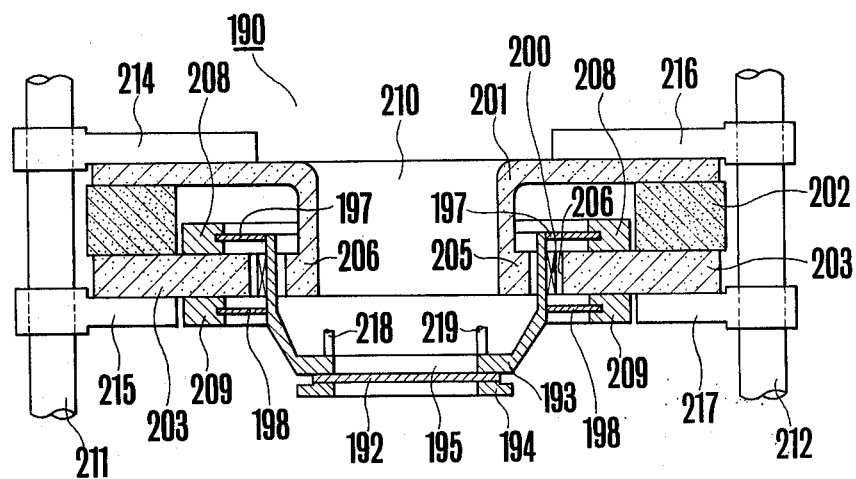
FIG. 11 is an enlarged sectional view showing a mask approaching device to be utilized for the combination of the mask and wafer shown in FIGS. 5 and 6.

A mask approaching device 190 is provided for approaching the wafer mounted on the platform 140 to a mask 192. FIG. 11 shows its enlarged sectional view. This device comprises a holding ring 194 for securing the periphery of the mask 192 to a pedestal 193 in a manner well known in the art. The pedestal has a cross-sectional configuration just like a cup provided at its bottom with an opening 195 having a diameter substantially the same as the inner diameter of the holding ring 194. Two spaced resilient flanges 197 and 198 extend in the horizontal or Z axis direction from the outer wall of the cup shaped pedestal 193 to permit vertical motion, and a driving coil 200 for moving the mask 192 in the vertical direction is wound on the pedestal 193 between the resilient flanges. Thus, the mask is moved in the vertical direction by about 100 microns by the driving coil. In this case the resilient flanges assure microadjustment.

The mask approaching device 190 comprises a cylindrical pole member 201 concentric with the Z axis and provided with a flange at its upper end, a ring shaped permanent magnet 202 and a ring shaped outer pole member 203 which are arranged as shown in FIG. 11 to form an annular magnetic circuit. The lower end of the inner pole member confronts the inner end of the outer pole member 203 with a definite air gap therebetween, and the driving coil 200 for the pedestal 193 is disposed in this air gap. As shown, the resilient flanges 197 and 198 are positioned on the opposite sides of the outer pole member 203 and the outer ends of the flanges are supported by clamping rings 208 and 209 secured to the inner surface of the outer member 203. The central opening 210 of the inner pole member 201 is made sufficiently large not to interfere with the passage of the working beam, an X ray beam, for example. Four vertical guide rods (only two of them 211 and 212 are shown) are connected to a stationary base, not shown, and arms 214 through 217 carried by these rods are used to support the mask approaching device 190. A plurality of electrodes 218 and 219 are secured to the holding ring 194 to extend through the lower portion of the pedestal 193 to which the mask is urged against. These electrodes constitute a relative height detector for measuring the spacing between the mask 192 and the wafer on the platform in terms of the variation of the electrostatic capacitance. Three electrodes, equally spaced in the circumferential direction may be used.

DRIVING SYSTEM FOR POSITION FINE ADJUSTING APPARATUS

The control system of the position finely adjusting apparatus shown in FIGS. 4 through 11 is illustrated in FIG. 12. As shown, there is provided an electronic computer 250 which acts as a control center for controlling the positions of the X and Y stages and of the rotary body in accordance with the information sent from various members of the position finely adjusting apparatus described above. The computer may be of a standard commercial type, and has the following input devices.

More particularly, the X speed detecting coil 63 mounted on the metal frame 59 of the X stage 55 and the compensating coil mounted on the inner pole member 69 are connected in series across the input terminals of an amplifier 252. The output of this amplifier is converted into digital information by a digital-analogue converter 253 and the digital information representing the speed of the X stage in the direction of X axis is sent to a multiplexer 254 which is connected to receive also the Y axis speed information produced by processing by a similar circuit to that described above the serially connected outputs of the Y speed detecting coil on the metal frame 96 of the Y stage 90 and the compensating coil 107 mounted on the inner pole member 103. As a result, the speed information signals are multiplexed by the multiplexer and then sent to the computer 250.

The signal from the electrode 73 which detects the capacitance variation, and hence the displacement resulting from the movement of the X stage 55 in the direction of X axis is processed by an operation circuit 260. For example, the operation circuit 260 operates according to a frequency modulation-frequency discriminating system. Where the displacement is large, variation of the frequency may be used. The operation circuit 260 sends a distance information regarding the distance of the movement of the X stage 55 in the direction of X axis to an analogue-digital converter 261 so that a digital information is sent to a second multiplexer. A distance information signal produced by the electrode 88 regarding the movement of the Y stage 90 in the direction of Y axis, a rotation angle ($\theta$) information signal produced by electrodes 109 and 109s which are added and processed as above described, an information signal regarding the distance of the movement of the workpiece in the direction of Z axis and an information signal regarding the inclination angle of the workpiece supporting platform 140 are also applied to the multiplexer 262. Consequently, the multiplexer 260 operates to multiplex these information signals and apply the multiplexed information signals to the computer 250.

The outputs from a group of light receivers 183 disposed to receive light beams 270 used to align the positions of the wafer 184 and the mask 192 are sent to a processing member 271 so as to judge whether the positions of the wafer and the mask are aligned or not. In this embodiment, the detection of the marks is effected by applying vibration so that when the driving coils 75 and 112 are energized in a manner to be described later, the X and Y stages 55 and 90 are vibrated. Upon coincidence of the marks of the wafer 184 and the mask 192, the second higher harmonic component of the outputs of the light receivers 183 becomes the largest, whereas in other cases the outputs contain the fundamental component. The processing member 271 discriminates between these components. In this case, in order to judge the polarity (high, low) of the frequency shift the output from a high frequency source 272 is applied to the processing member 271, the output thereof being applied to the computer 250 via a third multiplexer 275. Information signals from the other groups of the light receivers disposed beneath the workpiece supporting platform 140 are also applied to the multiplexer 275 so that superposed multiplexed information signals are applied to the computer 250.

The signal regarding the electrostatic capacitance between the mask 192 and the wafer 184 produced by the electrodes 218 secured to the holding ring 194 of the mask approaching device 190 is sent to an operation circuit 280 where it is converted into an information signal regarding the distance between the mask and the wafer. The output from the operation circuit 280 is applied to a multiplexer 282 via an analogue-digital converter 281. Signals from electrode 219 and other electrodes are also processed and applied to the multiplexer 282. Accordingly, the multiplexer 282 operates to multiplex these signals and send its outputs to the computer 250.

In response to these various input information signals, the computer 250 provides an optimum control signal to a controller 290 indicating which one of the component elements should be controlled and to what extent. On the output side of the controller 290, are provided a source of constant current 300, sources of constant voltage 302 and 303 and a selection circuit 304 in addition to the high frequency circuit 304. The outputs from these sources applied to the load are controlled in accordance with the output from the controller 290. Thus, to the output of the constant current source 300 are connected the driving coils 62 and 100 for the dynamic electromechanical transducers 61 and 99 of the X and Y stages, and the driving coil 200 secured to the mask carrying pedestal 193 of the mask approaching device 190. 4 sets of the bending type electromechanical transducers 126 through 129 for rotating the rotary body 120 are connected to the output of the constant voltage source 302. In the same manner three sets of bending type electro-mechanical transducers 150, 151 and 152 are connected to the output of the constant voltage source 303 for adjusting the inclination of the workpiece supporting platform 140. The selection circuit 304 connected to the output of the high frequency source 272 determines which one of the dynamic electromechanical transducers 74 and 111 for vibrating the X and Y stages 55 and 90 in the X or Y axis direction and which one of the bending type electro-mechanical transducers 150, 151 and 152 for rotating the rotary body 120 should be operated when detecting the marks on the mask and the wafer. The driving coils 75 and 112 of the dynamic type electro-mechanical transducers 74 and 111 are connected to the high frequency source 272 via selection circuit 304, whereas the driving coils of the bending type electro-mechanical transducers 150, 151 and 152 are connected to the high frequency source 272 via a portion of the constant voltage source 302.

The damping coils 76 and 113 mounted on the X and Y stages 55 and 90, respectively, for preventing the transient vibrations thereof are short circuited or connected to a definite load through controller 290 by the computer 250 when the variation in the speed of the X and Y stages in the direction of X and Y axes exceeds a predetermined value.

A portion of the input-output means for automating the operation during the coarse adjustment is not shown in FIG. 12.

The position adjusting apparatus embodying the invention and the mask approaching device described above align the positions of the wafer and the mask in the following manner.

MOUNTING OF THE MASK AND THE WAFER

At first a method of utilizing vibrations for detecting the marks will be described. Mask 192 provided with a plurality of sets of the perforations having predetermining positions and dimensions is secured to the pedestal 193 by utilizing the holding ring 194 of the mask approaching device 190, said perforations being used as the coarsely adjusting marks which are used to decrease the difference or error of the relative position from about ±100 microns to about ±10 microns with respect to axes X and Y and angle $\theta$, and as the finely adjusting marks which are utilized to decrease the difference from ±10 microns to less than ±0.1 micron.

Then wafer 184 perforated with perforations at predetermined positions and having predetermined dimensions required to effect coarse and fine adjustments is mounted on the workpiece supporting table 140 by using a well known wafer carrier, not shown, capable of mounting the wafer at a predetermined position of the surface of the carriage 140 with an accuracy of about ±100 microns. Concurrently with the mounting of the wafer on the platform 140, the source of reduced pressure is connected to attract the wafer 184 to the surface of the platform 140 via pipe 182, nipple 181, manifold 180 and a plurality of suction openings 179 through the platform 140.

ADJUSTMENT OF THE RELATIVE SPACING BETWEEN WAFER AND MASK

Then, the mask approaching device 190 already mounted with wafer 192 is brought near the wafer 184 to be in the operating range of the adjusting apparatus of this invention (±100 microns in the direction of X, Y and Z axes, respectively, ±1' of rotation angle $\theta$ and ±0.1' of parallelness). Such accuracy of relative positions can readily be attained by ordinary working, assembling and finishing techniques, so it is not necessary to use any special mechanism.

In this manner, when the mask 192 is brought near the wafer 184 within the range of accuracy described above, the computer 250 causes various component elements to operate as follows such that the information produced by the electrodes 218 and 219 mounted on the mask approaching device 190 and representing the relative spacing between the mask and the wafer will have a preset value, for example 3 microns ± 1 micron. More particularly, the constant current source 300 is energized through the controller for supplying control current to the driving coil of the mask approaching device so as to bring the mean spacing between the mask and the wafer which is measured by electrodes 218 and 219 to the preset value. Further, the computer 250 energizes the bending type electro-mechanical transducers 150, 151 and 152 through controller 290 and the constant voltage source 303 so as to adjust the relative inclination of the mask and wafer while the relative spacing obtained by the electrodes 218 and 219 is maintained constant. In this case, the desired vertical movement of mask 192 is assured by the resilient plates 197 and 198, and since the stroke of this vertical movement is at most about 100 microns it is possible to make the resilient plates 197 and 198 to have a considerably high stiffness. Moreover as the total mass of mask 192, holding ring 194 and pedestal 193 is small it is possible to make the resonance frequency of the mechanical vibrating system constituted by the mask approaching device 190 to be equal to the fundamental frequency (from 100 to several K Hz) of the mechanical vibrating system constituted by the bending type electro-mechanical transducers 150, 151 and 152 utilized to adjust the inclination and by the workpiece supporting platform 140 with the result that even when the vertical movement is controlled at a considerably high speed, the control would not depart from the resilient control range of the system. Thus, it is possible to attain the target accuracy within a short time of about several milliseconds.

COARSE ADJUSTMENT

After the relative spacing between the mask and the wafer has been determined by the method described above, the computer 250 energizes the high frequency source 272 via controller 290 while at the same time sends a selection signal to the selection circuit 304, thereby actuating driving coils 75 and 112 for superimposing the X axis and Y axis vibrations. In this case, the driving coils 75 and 112 are supplied with driving currents having different frequencies and an amplitude of about 100 microns. The light beams passing through the coarsely adjusting marks of the wafer and mask are detected by a group of light receivers (although not shown, similar to the group of light receivers 183) and the computer 250 continues to energize the constant current source 300 for supplying zero frequency driving current to the zero frequency driving coils 59 and 60 acting to feed in the directions of X and Y axes, respectively, until the alignment error is reduced to a minimum. When desired, the computer also drives the constant voltage source 302 for supplying a driving voltage to the rotary body 130. In this case, the displacement in the direction of X axis drives the Y stage 90, that is the metal frames 59 and 60 and coils 62, 63, 75 and 76 mounted thereon through the air gaps between the outer pole members 67 and 79 and the inner pole members respectively in the direction of X axis. These air gaps are constructed to permit an eccentricity of the order of about 100 microns. Since it is possible to predetermine suitable dimensions that assure constant air gap frequency it is possible to neglect the variation of the transformation coefficients of respective coils caused by the eccentricity. It is easy to select the dimensions of the poles of respective transducers 61, 74, 99 and 111 for driving the X and Y stages in the directions of the X and Y axes respectively, so as to maintain constant magnetic field irrespective of the axial displacements of the coils of the order of about ±0.3 microns so that the linearity of the displacements of respective transducers in respective directions can be assured.

FINE ADJUSTMENT

As soon as the alignment error at the time of coarse adjustment has been reduced to the minimum the detection of the fine adjustment marks becomes possible. Accordingly, the computer 250 controls the constant current source 300 via controller 290 so as to decrease the current for decreasing the displacement to the order of ±10 microns. At the same time, the control step of the zero frequency driving current is finely divided to make position alignment with the target accuracy by repeating control operations similar to those of the coarse adjustment.

With reference to the angular rotation in the direction of angle $\theta$, in response to the result of detection of the position aligning marks, the computer 250 energizes the constant voltage source 302 via the controller 290 thus driving respective bending type electro-mechanical transducers 126 through 129. Accordingly, the rotary body is controlled to rotate in one direction and other.

In a series of controls described above, the control that is to be performed at a relatively high speed is the position controls along the X and Y axes during the coarse adjusting step. Especially, during the movement in the direction of X axis, other adjusting systems for the wafer 184 act as a load for the X stage 55 and since such movement requires a large stroke the practical limit of the resonance frequency of the entire system ranges from 100 to 300 Hz (in the direction of Y axis, from 300 to 500 Hz). For this reason, in order to prevent a transient vibration caused by an excessive control or by an external disturbance, the computer 250 must supervise the detected outputs of the speed detecting coils 63 and 101 for the directions of X and Y axes respectively so as to energize the damping coils 76 and 113 for preventing the transient vibrations through the controller 290 thus applying damping forces. In this regard, damping coils 76 and 113 are supplied with currents corresponding to the outputs from the speed detecting coils or connected with a constant load.

The amount of displacement from reference points regarding respective coordinate axes, particularly X and Y axes is calculated by the operating circuit 260 in accordance with the variation in the electrostatic capacitance produced by electrodes 73 and 88. In the same manner, the angle of rotation $\theta$ and the displacement along the vertical axis Z are detected by electrodes 109 and 108. In response to the amount of the detected displacement, the computer 250 controls the inputs to respective transducers. Where a plurality of electro-mechanical transducers are provided for driving in the directions of respective axes as in this example, the mutual correction of the transforming coefficients of transducers for respective axis directions becomes possible as well as the displacement-output transforming coefficients of respective displacement measuring circuits. Accordingly, by correcting beforehand the absolute interval from the reference point by using a laser interferometer it is possible to control the absolute value, if desired, whereby it is not necessary to use the laser interferometer during the normal operation.

By using a laser interferometer and other experimental instruments it was found that the mutual interference of respective axes of the illustrated apparatus for finely adjusting positions was less than 0.02 micron for a displacement of 10 microns, that the number of hystereses was less than 0.02 micron for the displacement of 10 microns and that the resolution was less than 0.05 micron.

Where the mark is detected by scanning the detection beam instead of superimposing vibrations, the vibration driving coils 75 and 112 may be connected in series opposition with respective zero frequency driving coils 62 and 62 and 100 thereby increasing the driving force. Other basic operations are quite the same as in the vibration superposing method described above.

According to still another method of detecting the mark, a rotary vibration is imparted to the wafer. In this case, the movement of the rotary body is superimposed upon the vibration caused by the bending type electromechanical transducers 126 through 129. Other operations are the same as the method described hereinabove.

Although in this embodiment pairs of marks are provided for coarse and fine adjustments a pair of marks may be combined into a single mark for both adjustments, in which case during the coarse adjustment only the quantity of the light is detected so long as the light through a plurality of marks can be received and thereafter vibration is applied for fine adjustment.

Further, in this example, the light passing through the mark perforations is received but it will be clear that a system that utilized light reflected by the reference mark can also be used. Further complementally marks can also be used.

Where it is possible to increase the thickness of the mask thereby increasing its mechanical strength the relative position of the mask and the wafer can be reversed.

Further, in this embodiment, since the displacement measuring points move in three dimensional directions the effect of the mutual interference between the displacement and the modulating frequency caused by a number of approaching operations can be minimized by randomly selecting the center frequencies of respective frequency modulator constituted by the operation circuits 260, 280, etc. at about 200 KHz.

Above description describes the application of this invention to a fine adjustment of the positions of the mask and wafer utilized to fabricate large integrated circuits it should be understood that the invention can equally be applied to any applications requiring accurate position adjustment. Among such applications are included a precise operating stand for topographic X ray device, a position adjusting device for working with a laser beam in combination with a large stroke coarse adjuster, a position indexing device for ultra microfiche photographing, apparatus for indexing the working position of component parts at extremely high accuracies, apparatus for determining the search positions of very small bodies at high accuracies, high accuracy microscopes, and apparatus for adjusting the position of sample supports. It is also possible to use not only the concurrent projection and exposure but also a step-and-repeat type projection and exposure combined with a high speed coarsely adjusting mechanism and a pattern regenerator.

Further, in the illustrated embodiment annular vibrating diaphragms were used as the resilient members for supporting the X and Y stages, it is also possible to use plate like members of any configuration such as rectangular or elliptical plate having a central opening.

Instead of using a box shaped and cylindrical X and Y stages, many other modifications are possible. For example, the X stage may be supported by any resilient supporting member having a configuration permitting the mounting of the supporting member of the Y stage. Any type of the Y stage may be used provided that it includes portions on the opposite ends that can be supported by resilient supports and that it has a flat central portion.

It is also possible to mount electro-mechanical transducers bendable in the direction of Z axis on the Y stage where the position adjustment in the rotary direction is not necessary. In this manner, it should be noted that the construction of the embodiment may be varied variously depending upon the field of application.

The embodiment described above has advantages enumerated hereunder.

1. Since respective stages are driven by dynamic electro-mechanical transducers it is possible to assure uniform driving force throughout the entire stroke of the respective stages thus making it possible to finely adjust the position at high accuracies.

2. The X and Y stages are supported by resilient supporting members and have respective axes which intersect at right angles in a common plane, and each stage is provided with a pair of opposing coaxial permanent magnets (the configuration, air gap flux density and the leakage flux distribution are the same for all axes), so that the leakage fluxes cancel with each other thereby eliminating the mutual interaction due to magnetic coupling between driving forces for respective axes.

3. In addition, since the driving coils of the X and Y stages are wound about X and Y axes respectively, when the driving coil of the Y stage moves in the direction of X axis in the flux of the permanent magnet for driving the stage in the direction of Y axis with the movement of the X stage since the flux density in the air gap of the Y stage is uniform, the coefficient of spring does not vary. This makes it possible to eliminate the mutual interference between the driving forces of respective axes.

4. As each stage is driven by a dynamic type electro-mechanical transducer the transformation between electro and mechanical forces is effected linearly thus eliminating hysteresis.

5. The use of the dynamic type electro-mechanical transducers enables to determine the direction of the flux of respective stages to any desired direction. Thus, if desired it is possible to cause the fluxes of respective stages to cancel each other. Disposition of the transducers on both ends of the stages as shown in the embodiment is especially effective.

6. Where the dynamic type electro-mechanical transducers are used, due to the movement of the coil of the X axis (X stage) the coil of the Y axis (Y stage) can move freely through the annular air gap of the transducer so that the coefficient of the driving force does not vary.

7. Since each stage is supported by a pair of annular resilient supporting members any displacement in the direction of Z axis and any rotation do not occur thus assuring linear movements along X and Y axes. In addition, since there is no fear of transverse movement, no parasitic vibration is created even though high frequency vibrations are applied to create linear motion.

8. It is also possible to considerably increase the resonance frequency of the mechanical vibrating systems for causing movements along respective axes, thus enabling to widen the frequency range for controlling resiliency. Accordingly, it is possible to provide analogue like feeding with small increments of 0.001 micron, which could never been attained by the prior art technique.

9. Since the rotary body is supported by a plurality of bending type electro-mechanical transducers arranged in the direction of Z axis and since a plurality of the sets of the transducers are radially disposed with an equal angular spacing it is possible to apply pure rotary force to the rotary body not including components in the other directions.

10. In addition to the construction just described by disposing resilient plates between radially disposed transducers, the elongation in the direction of Z axis is limited thus preventing inadequate operation of the transducers. In addition it is also possible to prevent mutual interferences among the movements in the directions of X, Y and Z axes.

the Since all of the stages, rotary bodies and workpiece supporting platforms are supported by resilient supporting members it is not only possible to increase as desired th resonance frequencies of the mechanical vibrating systems that create movements in the directions of X, Y and Z axes as well as rotary movements but also possible to select any spacing between the resonance frequencies. Accordingly, it is possible to make large the difference between the resonance frequency under normal operation and the frequency of an external disturbance normally exceptable.

12. Since it is possible to adjust the height and inclination of the workpiece supporting platform by the bending type electro-mechanical transducers, when applied to the concurrent exposure of a mask and a wafer, for example, the parallelness of these workpieces can readily be adjusted, whereas when the apparatus is used to form a mask pattern it is possible to adjust the mask to assume any desired angular position with respect to the working beam.

13. Since no sliding element, bearing and gear or like motion transmitting means is used, there is no backlash, friction, etc.

14. As the driving members for creating movements in the directions of X and Y axes which are required to have relatively large strokes are used the dynamic type electro-mechanical transducers having linear characteristics over wide range of operation so that it is possible to perform a linear control over a wide range of movement thereby enabling fine and coarse adjustments by the same apparatus. This simplifies the construction of the control system.

15. Since the movements in the directions of X and Y axes as well as the rotation are created by opposed electro-mechanical transducers of the same type, their characteristics can be corrected mutually thus enabling accurate and ready correction of the electro-mechanical transforming coefficients of respective driving mechanisms. Accordingly, it is possible to measure the absolute value of the displacement by combining a conventional frequency modulation-frequency discriminator that detects the variation in electrostatic capacitance. Accordingly, it is not only possible to control the absolute value without using a number of such expensive displacement measuring apparatus as a laser interferometer, a photoelectric microscope or the like but also possible to perform closed loop control.

16. Since the dynamic type electro-mechanical transducers utilized to drive in the X and Y axis directions has a magnetic circuit construction of small magnetic leakage having a magnet at the center, even when the magnetic circuits of two driving transducers are positioned closely adjacent no DC or AC interaction occurs therebetween thus making small and compact the construction.

17. Summarizing the above it is possible to provide apparatus for stably and finely adjusting the position of a workpiece at a high speed and at an extremely high accuracy that cannot be attained by the prior art apparatus. Moroever, the apparatus is compact.

While the invention has been shown and described in terms of a preferrred embodiment thereof it will be clear that many changes and modifications are obvious to one skilled in the art without departing the true spirit and scope of the invention as defined in the appended claims.

What is claimed is:

1. Fast acting composite coarse and fine position adjusting apparatus comprising a stationary frame, first and second movable stages respectively arranged to be movable along first and second axes intersecting at right angles in a plane, dynamic electro-mechanical transducer means mounted on respective axial ends of the respective stages, first resilient supporting means for supporting said first stage on said stationary frame to be movable in the direction of said first axis, second resilient supporting means mounted on said first stage for supporting said second stage to be movable in the direction of said second axis, means mounted on said second stage for supporting an object whose position is to be adjusted within very fine tolerances, combined coarse and fine position measuring electrode means coacting with the respective stages for deriving output electric signals representative of the position of the respective stages, feedback control means responsive to the output electric signals from the position measuring electrode means for controlling operation of said dynamic electro-mechanical transducer means, direct current supply means supplying selected ones of the dynamic electro-mechanical transducer means under the control of the feedback control means for displacing the first and second movable stages along the respective first and second axis of movement in an essentially steady state manner, and alternating current supply means supplying other ones of said dynamic electro-mechanical transducer means under the control of said feedback control means for imparting limited vibratory motion to the first and second stages along their respective axis of movement whereby the position measuring electrode means is enabled to derive output electric signals representative of the position of the respective stages over a wide range of displacement and the position of the stages is adjusted within very fine tolerances.

2. The apparatus according to claim 1 further including damping coil means coacting with the respective dynamic electro-mechanical transducer means and speed sensing coil means for sensing the speed of movement of the first and second movable stages, respectively, the output signals from said speed sensing coil means being applied to said feedback control means for deriving damping currents for supply to said damping coil means for preventing undesired overshoot and oscillation of the position adjusting apparatus about a final desired position.

3. The apparatus according to claim 1 wherein each one of said dynamic type electro-mechanical transducer means has a substantially closed magnetic circuit having a magnetic pole at the center thereof and a driving coil.

4. The apparatus according to claim 1 wherein said first movable stage comprises a cubic box having a first pair of walls extending in the direction of said first axis and a second pair of walls extending in the direction of said second axis.

5. The apparatus according to claim 4 wherein second resilient supporting means for supporting said second stage are depending from said second pair of walls extending in the direction of said second axis and said first pair of walls extending in the direction of said first axis are depending from said stationary frame on said first resilient supporting means.

6. The apparatus according to claim 1 wherein said means for supporting said object to be adjusted includes rotary body means mounted on said second stage and rotatable about a third axis perpendicular to the plane of said first and second axes at the point of intersection thereof.

7. The apparatus according to claim 6 wherein said rotary body means is rotatably mounted by bending type electro-mechanical transducer means seated on a supporting post secured to said second movable stage.

8. The apparatus according to claim 7 wherein said bending type electro-mechanical transducer means comprises a plurality of electrostriction elements which extend radially from the supporting post and are arranged in a plurality of sets with each set extending in the axial direction of said supporting post and with the plurality of sets equally angularly spaced about said supporting post.

9. The apparatus according to claim 6 further comprising additional electrode means coacting with the rotary body means for deriving output electric signals representative of the angular position of said rotary body means, and means for supplying the output signal from said additional electrode means to said feedback control means for controlling the angular rotation of said rotary body means.

10. The apparatus according to claim 8 further comprising a plurality of radial reinforcing members disposed between adjacent sets of said electrostriction elements, said reinforcing members being connected between said supporting post and said rotary body means.

11. The apparatus according to claim 10 further comprising additional electrode means coacting with the rotary body means for deriving output electric signals representative of the angular position of said rotary body means, and means for supplying the output signal from said additional electrode means to said feedback control means for controlling the angular rotation of said rotary body means.

12. The apparatus according to claim 11 further including means for adjusting the height of the object whose position is to be adjusted in a direction perpendicular to said first and second axes and for adjusting the inclination of said object is interposed between said rotary body means and said means for supporting said body whose position is to be adjusted.

13. The apparatus according to claim 12 wherein said height adjusting means comprises a plurality of electromechanical transducers bendable in the direction of said third axis perpendicular to said first and second axes, said transducers being disposed about said supporting post at an equal circumferential spacing.

14. The apparatus according to claim 13 wherein each one of said first and second resilient supporting means is generally annular in shape and said second resilient supporting means is at least an order of magnitude less stiff than said first resilient supporting means.

15. The apparatus according to claim 14 further including means for sensing that the first and second frame have moved the object to be finely positioned to within a predetermined tolerance range, said feedback control means being responsive to said last mentioned means to cut back automatically the magnitude of the excitation current supplied from said direct current supply means to said dynamic electro-mechanical transducer means to a preset small value whereby the first and second movable stages therefter are moved only in incrementally smaller steps to finally adjust the position of an object to within the desired positional tolerance.

16. The apparatus according to claim 15 further including damping coil means coacting with the respective dynamic electro-mechanical transducer means and speed sensing coil means for sensing the speed of movement of the first and second movable stages, respectively, the output signals from said speed sensing coil means being supplied to said feedback control means for deriving damping currents for supply to said damping coil means for preventing undesired overshoot and oscillation of the position adjusting apparatus about a final desired position.

17. The apparatus according to claim 16 further including coarse and fine position marking means secured to and movable with said first and second movable stages, coarse and fine position marking means sensing means for viewing and sensing said coarse and fine marking means and deriving output electric coarse and fine position sensing signals for supply to said feedback control means for use in controlling operation of said dynamic electro-mechanical transducer means, said feedback control means utilizing the coarse position marking means sensing signal in the control of the positioning of the first and second movable stages while the stages are grossly positioned within a tolerance range of the order of plus or minus 100 microns and utilizing the fine position marking means upon the adjusted position of the apparatus being positioned within a tolerance range of the order of plus or minus 10 microns whereby positioning of an object to within 0.01 microns is achievable with the apparatus.

18. The apparatus according to claim 1 wherein each one of said first and second resilient supporting means is generally annular in shape and said second resilient supporting means is at least an order of magnitude less stiff than said first resilient supporting means.

19. The apparatus according to claim 1 further including means for sensing that the first and second frame have moved the object to be finely positioned to within a predetermined tolerance range, said feedback control means being responsive to said last mentioned means to cut back automatically the magnitude of the excitation current supplied from said direct current supply means to said dynamic electro-mechanical transducer means to a preset small value whereby the first and second movable stages thereafter are moved only in incrementally smaller steps to finally adjust the position of an object to within the desired positional tolerance.

20. The apparatus according to claim 1 further including coarse and fine position marking means secured to and movable with said first and second movable stages, coarse and fine position marking means sensing means for viewing and sensing said coarse and fine marking means and deriving output electric coarse and fine position sensing signals for supply to said feedback control means for use in controlling operation of said dynamic electro-mechanical transducer means, said feedback control means utilizing the coarse position marking means sensing signal in the control of the positioning of the first and second movable stages while the stages are grossly positioned within a tolerance range of the order of plus or minus 100 microns and utilizing the fine position marking means upon the adjusted position of the apparatus being positioned within a tolerance range of the order of plus or minus 10 microns whereby positioning of an object to within 0.01 microns is achievable with the apparatus.

21. Fast acting composite coarse and fine position adjusting apparatus comprising a stationary frame, first and second movable stages respectively arranged to be movable along first and second axes intersecting at right angles in a plane, dynamic electro-mechanical transducer means mounted on respective axial ends of the respective stages, first resilient supporting means mounted on said stationary frame for supporting said first movable stage to be movable in the direction of said first axis, second resilient supporting means mounted on said first movable stage for supporting said second movable stage to be movable in the direction of said second axis, a plurality of bending type electro-mechanical transducer means each having one end secured to said second movable stage to extend in the radial direction with respect to a third axis perpendicular to the plane of said first and second axes at the point of intersection thereof, said bending type transducer means being bendable about said third axis, rotary body means supported by the remaining ends of said bending type electro-mechanical transducer means for supporting an object to be adjusted and a plurality of position measuring electrodes for detecting the movements of said first and second movable stages and said rotary body means by the change in the electrostatic capacitance.

22. The apparatus according to claim 21 wherein said electrodes are arranged on the first and second axes of respective stages.

23. The apparatus according to claim 21 wherein respective electrodes are displaced from respective axes.

24. The apparatus according to claim 21 wherein the ends of second bending type electro-mechanical transducers which support said rotary body means for supporting said object are connected to a resilient seat mounted on a supporting post secured to said second movable stage.

25. The apparatus according to claim 24 wherein said resilient seat is connected to a shaft extending in parallel with said supporting post through intermediate resilient plates connected to one ends of said second bending type electro-mechanical transducers, and said shaft is connected to a resilient member received in a recess formed on the upper end of said supporting post.

26. The apparatus according to claim 25 wherein said resilient members is an annular body provided with a rigid cylindrical member at the center thereof.

27. The apparatus according to claim 26 wherein said object supporting means is connected to a ring having a peripheral portion connected to said rotary body through stabilizing resilient members.

* * * * *